United States Patent
Yamazaki et al.

(10) Patent No.: US 7,468,526 B2
(45) Date of Patent: Dec. 23, 2008

(54) SEMICONDUCTOR DEVICE, METHOD OF FABRICATING SAME, AND ELECTROOPTICAL DEVICE

(75) Inventors: Shunpei Yamazaki, Setagaya (JP); Yasuyuki Arai, Atsugi (JP); Satoshi Teramoto, Ayase (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 15 days.

(21) Appl. No.: 10/852,124

(22) Filed: May 25, 2004

(65) Prior Publication Data

US 2005/0045884 A1 Mar. 3, 2005

Related U.S. Application Data

(60) Division of application No. 09/118,010, filed on Jul. 17, 1998, now abandoned, which is a division of application No. 08/962,840, filed on Nov. 3, 1997, now Pat. No. 6,429,053, which is a continuation of application No. 08/575,355, filed on Dec. 20, 1995, now abandoned.

(30) Foreign Application Priority Data

Dec. 27, 1994 (JP) .................................. 06-339162

(51) Int. Cl.
*H01L 31/06* (2006.01)
(52) U.S. Cl. .......................................... 257/66; 257/59
(58) Field of Classification Search ................ 257/57, 257/59, 72, 66, 49; 438/161
See application file for complete search history.

(56) References Cited

U.S. PATENT DOCUMENTS

| 3,657,613 | A | 4/1972 | Brody et al. |
|---|---|---|---|
| 4,065,781 | A | 12/1977 | Gutknecht |
| 4,068,020 | A | 1/1978 | Reuschel |
| 4,103,297 | A | 7/1978 | McGreivy et al. |
| 4,239,346 | A | 12/1980 | Lloyd |
| 4,365,013 | A | 12/1982 | Ishioka et al. |
| 4,378,417 | A | 3/1983 | Maruyama et al. |
| 4,448,491 | A | 5/1984 | Okubo |
| 4,569,903 | A | 2/1986 | Hashiue et al. |

(Continued)

FOREIGN PATENT DOCUMENTS

EP 0 161 555 11/1985

(Continued)

OTHER PUBLICATIONS

Office Action dated Sep. 23, 2004 in U.S. Appl. No. 10/852,125.

(Continued)

*Primary Examiner*—Roy K Potter
(74) *Attorney, Agent, or Firm*—Eric J. Robinson; Robinson Intellectual Property Law Office, P.C.

(57) ABSTRACT

A pair of substrates forming the active matrix liquid crystal display are fabricated from resinous substrates having transparency and flexibility. A thin-film transistor has a semiconductor film formed on a resinous layer formed on one resinous substrate. The resinous layer is formed to prevent generation of oligomers on the surface of the resinous substrate during formation of the film and to planarize the surface of the resinous substrate.

20 Claims, 3 Drawing Sheets

U.S. PATENT DOCUMENTS

| | | | |
|---|---|---|---|
| 4,582,395 A | 4/1986 | Morozumi | |
| 4,591,892 A | 5/1986 | Yamazaki | |
| 4,597,160 A | 7/1986 | Ipri | |
| 4,609,930 A | 9/1986 | Yamazaki | |
| 4,636,038 A | 1/1987 | Kitahara et al. | |
| 4,643,526 A | 2/1987 | Watanabe et al. | |
| 4,680,580 A | 7/1987 | Kawahara | |
| 4,740,829 A | 4/1988 | Nakagiri et al. | |
| 4,746,628 A | 5/1988 | Takafuji et al. | |
| 4,799,772 A | 1/1989 | Utsumi | |
| 4,818,077 A | 4/1989 | Ohwada et al. | |
| 4,860,069 A | 8/1989 | Yamazaki | |
| 4,862,237 A | 8/1989 | Morozumi | |
| 4,868,014 A | 9/1989 | Kanai et al. | |
| 4,888,305 A | 12/1989 | Yamazaki et al. | |
| 4,891,330 A | 1/1990 | Guha et al. | |
| 4,897,360 A | 1/1990 | Guckel et al. | |
| 4,938,565 A | 7/1990 | Ichikawa | |
| 4,949,141 A | 8/1990 | Busta | |
| 4,954,985 A | 9/1990 | Yamazaki | |
| 4,959,700 A | 9/1990 | Yamazaki | |
| 4,969,025 A | 11/1990 | Yamamoto et al. | |
| 4,969,031 A | 11/1990 | Kobayashi et al. | |
| 4,986,213 A | 1/1991 | Yamazaki et al. | |
| 5,003,356 A | 3/1991 | Wakai et al. | |
| 5,012,228 A | 4/1991 | Masuda et al. | |
| 5,032,883 A | 7/1991 | Wakai et al. | |
| 5,051,570 A | 9/1991 | Tsujikawa et al. | |
| 5,054,887 A | 10/1991 | Kato et al. | |
| 5,055,899 A | 10/1991 | Wakai et al. | |
| 5,056,895 A | 10/1991 | Kahn | |
| 5,066,110 A | 11/1991 | Mizushima et al. | |
| 5,077,223 A | 12/1991 | Yamazaki | |
| 5,077,233 A | 12/1991 | Mukai | |
| 5,084,905 A | 1/1992 | Sasaki et al. | |
| 5,085,973 A | 2/1992 | Shimizu et al. | |
| 5,107,308 A | 4/1992 | Koezuka et al. | |
| 5,132,754 A | 7/1992 | Serikawa et al. | |
| 5,132,821 A | 7/1992 | Nicholas | |
| 5,148,301 A | 9/1992 | Sawatsubashi et al. | |
| 5,200,846 A * | 4/1993 | Hiroki et al. | 349/174 |
| 5,200,847 A | 4/1993 | Mawatari et al. | |
| 5,206,749 A | 4/1993 | Zavracky et al. | |
| 5,229,644 A | 7/1993 | Wakai et al. | |
| 5,231,297 A | 7/1993 | Nakayama et al. | |
| 5,247,191 A | 9/1993 | Yamazaki et al. | |
| 5,250,818 A | 10/1993 | Saraswat et al. | |
| 5,250,931 A | 10/1993 | Misawa et al. | |
| 5,261,156 A | 11/1993 | Mase et al. | |
| 5,268,777 A | 12/1993 | Sato | |
| 5,287,205 A * | 2/1994 | Yamazaki et al. | 349/174 |
| 5,289,300 A | 2/1994 | Yamazaki et al. | |
| 5,304,895 A | 4/1994 | Ujihara | |
| 5,313,322 A | 5/1994 | Takanashi et al. | |
| 5,327,001 A | 7/1994 | Wakai et al. | |
| 5,334,859 A | 8/1994 | Matsuda | |
| 5,339,180 A | 8/1994 | Katoh | |
| 5,341,012 A | 8/1994 | Misawa et al. | |
| 5,346,850 A | 9/1994 | Kaschmitter et al. | |
| 5,347,144 A | 9/1994 | Garnier et al. | |
| 5,354,497 A | 10/1994 | Fukuchi et al. | |
| 5,376,561 A | 12/1994 | Vu et al. | |
| 5,377,031 A | 12/1994 | Vu et al. | |
| 5,403,756 A | 4/1995 | Yoshinouchi et al. | |
| 5,421,908 A | 6/1995 | Yoshida et al. | |
| 5,427,961 A | 6/1995 | Takenouchi et al. | |
| 5,436,744 A | 7/1995 | Arledge et al. | |
| 5,453,350 A | 9/1995 | Kurachi et al. | |
| 5,456,763 A | 10/1995 | Kaschmitter et al. | |
| 5,470,619 A | 11/1995 | Ahn et al. | |
| 5,470,681 A | 11/1995 | Brunner et al. | |
| 5,477,309 A | 12/1995 | Ota et al. | |
| 5,481,432 A | 1/1996 | Tsukada et al. | |
| 5,495,353 A | 2/1996 | Yamazaki et al. | |
| 5,498,573 A | 3/1996 | Whetten | |
| 5,500,537 A | 3/1996 | Tsumura et al. | |
| 5,510,918 A | 4/1996 | Matsunaga et al. | |
| 5,521,107 A | 5/1996 | Yamazaki et al. | |
| 5,526,149 A | 6/1996 | Kanbe et al. | |
| 5,527,998 A * | 6/1996 | Anderson et al. | 174/255 |
| 5,529,951 A | 6/1996 | Noguchi et al. | |
| 5,530,265 A | 6/1996 | Takemura | |
| 5,535,027 A | 7/1996 | Kimura et al. | |
| 5,539,550 A | 7/1996 | Spitzer et al. | |
| 5,541,748 A | 7/1996 | Ono et al. | |
| 5,569,610 A | 10/1996 | Zhang et al. | |
| 5,572,046 A | 11/1996 | Takemura | |
| 5,574,292 A | 11/1996 | Takahashi et al. | |
| 5,576,231 A | 11/1996 | Konuma et al. | |
| 5,576,868 A | 11/1996 | Togashi | |
| 5,576,869 A | 11/1996 | Yoshida | |
| 5,596,023 A | 1/1997 | Tsubota et al. | |
| 5,612,799 A | 3/1997 | Yamazaki et al. | |
| 5,614,733 A | 3/1997 | Zhang et al. | |
| 5,619,045 A | 4/1997 | Konuma et al. | |
| 5,627,404 A | 5/1997 | Takenouchi et al. | |
| 5,631,753 A | 5/1997 | Hamaguchi et al. | |
| 5,646,432 A | 7/1997 | Iwaki et al. | |
| 5,654,811 A | 8/1997 | Spitzer et al. | |
| 5,667,720 A | 9/1997 | Onishi et al. | |
| 5,672,518 A | 9/1997 | Hayashi et al. | |
| 5,672,900 A | 9/1997 | Konuma et al. | |
| 5,677,041 A | 10/1997 | Smayling | |
| 5,701,167 A | 12/1997 | Yamazaki | |
| 5,712,496 A | 1/1998 | Takahashi et al. | |
| 5,717,223 A | 2/1998 | Hack et al. | |
| 5,717,224 A | 2/1998 | Zhang | |
| 5,744,818 A | 4/1998 | Yamazaki et al. | |
| 5,747,355 A | 5/1998 | Konuma et al. | |
| 5,747,928 A | 5/1998 | Shanks et al. | |
| 5,757,456 A | 5/1998 | Yamazaki et al. | |
| 5,759,878 A | 6/1998 | Hayashi et al. | |
| 5,766,977 A | 6/1998 | Yamazaki | |
| 5,776,803 A | 7/1998 | Young | |
| 5,781,164 A | 7/1998 | Jacobsen et al. | |
| 5,783,468 A | 7/1998 | Zhang et al. | |
| 5,786,242 A | 7/1998 | Takemura et al. | |
| 5,798,744 A | 8/1998 | Tanaka et al. | |
| 5,821,137 A | 10/1998 | Wakai et al. | |
| 5,821,138 A | 10/1998 | Yamazaki et al. | |
| 5,821,559 A | 10/1998 | Yamazaki et al. | |
| 5,834,327 A | 11/1998 | Yamazaki et al. | |
| 5,879,977 A | 3/1999 | Zhang et al. | |
| 5,894,151 A | 4/1999 | Yamazaki et al. | |
| 5,933,205 A * | 8/1999 | Yamazaki et al. | 349/43 |
| 6,013,928 A | 1/2000 | Yamazaki et al. | |
| 6,049,364 A | 4/2000 | Takahara et al. | |
| 6,110,770 A | 8/2000 | Zhang et al. | |
| 6,118,502 A | 9/2000 | Yamazaki et al. | |
| 6,242,758 B1 | 6/2001 | Yamazaki et al. | |
| 6,429,053 B1 | 8/2002 | Yamazaki | |
| 6,556,257 B2 | 4/2003 | Ino | |
| 6,566,711 B1 | 5/2003 | Yamazaki et al. | |
| 6,642,073 B1 | 11/2003 | Zhang et al. | |
| 6,819,316 B2 | 11/2004 | Schulz et al. | |
| 2003/0071953 A1 | 4/2003 | Yamazaki et al. | |
| 2004/0263712 A1 | 12/2004 | Yamazaki et al. | |
| 2005/0052584 A1 | 3/2005 | Yamazaki et al. | |

FOREIGN PATENT DOCUMENTS

| | | | |
|---|---|---|---|
| EP | 0231953 | * | 8/1987 |
| EP | 0 321 073 | | 6/1989 |
| EP | 0 586 220 | | 3/1994 |

| | | |
|---|---|---|
| JP | 49-077537 | 7/1974 |
| JP | 53-144297 | 12/1978 |
| JP | 55-032026 | 3/1980 |
| JP | 60-033863 | 2/1985 |
| JP | 60-035574 | 2/1985 |
| JP | 64-030272 | 2/1985 |
| JP | 60-066863 | 4/1985 |
| JP | 60-066865 | 4/1985 |
| JP | 61-141174 | 6/1986 |
| JP | 62-093974 | 4/1987 |
| JP | 62-126677 | 6/1987 |
| JP | 63-100777 | 5/1988 |
| JP | 63-279228 | 11/1988 |
| JP | 01-030272 | 2/1989 |
| JP | 01-068724 | 3/1989 |
| JP | 64-068724 | 3/1989 |
| JP | 1130131 | 5/1989 |
| JP | 01-156725 | 6/1989 |
| JP | 02-051129 | 2/1990 |
| JP | 02-103925 | 4/1990 |
| JP | 02-188723 | 7/1990 |
| JP | 02-210330 | 8/1990 |
| JP | 02-234134 | 9/1990 |
| JP | 03-004214 | 1/1991 |
| JP | 03-102325 | 4/1991 |
| JP | 03-163418 | 7/1991 |
| JP | 03-249625 | 11/1991 |
| JP | 04-170520 | 6/1992 |
| JP | 04-178633 | 6/1992 |
| JP | 04-184424 | 7/1992 |
| JP | 04-313273 | 11/1992 |
| JP | 04-335617 | 11/1992 |
| JP | 05-040278 | 2/1993 |
| JP | 05-072562 | 3/1993 |
| JP | 05-113572 | 5/1993 |
| JP | 05-119305 | 5/1993 |
| JP | 05-173120 | 7/1993 |
| JP | 05-218365 | 8/1993 |
| JP | 05-232494 | 9/1993 |
| JP | 05-249496 | 9/1993 |
| JP | 05-297364 | 11/1993 |
| JP | 05-299653 | 11/1993 |
| JP | 05-315362 | 11/1993 |
| JP | 06-075237 | 3/1994 |
| JP | 06-118440 | 4/1994 |
| JP | 06-163958 | 6/1994 |
| JP | 06-169086 | 6/1994 |
| JP | 06-186578 | 7/1994 |
| JP | 06-258661 | 9/1994 |
| JP | 06-289210 | 10/1994 |
| JP | 06-291291 | 10/1994 |
| JP | 06-291315 | 10/1994 |
| JP | 06-318701 | 11/1994 |
| JP | 06-333823 | 12/1994 |
| JP | 06-347774 | 12/1994 |
| JP | 06-347825 | 12/1994 |
| JP | 2900229 | 3/1999 |

OTHER PUBLICATIONS

Official Action for U.S. Appl. No. 09/118,010, dated Nov. 17, 2004, and Pending Claims as of Nov. 26, 2003.
Specification, claims, abstract and drawings of U.S. Appl. No. 10/815,654, filed Apr. 2, 2004.
Specification, claims, abstract and drawings of U.S. Appl. No. 10/815,653, filed Apr. 2, 2004.
Specification, claims, abstract and drawings of U.S. Appl. No. 10/852,125, filed May 25, 2004.
Specification, claims, abstract and drawings of U.S. Appl. No. 10/925,980, filed Aug. 26, 2004.
Official Action for U.S. Appl. No. 10/925,980 dated Feb. 7, 2005.
C. Yeh, *Novel Technique for SiO₂ Formed by Liquid-Phase Deposition for Low-Temperature Processed Polysilicon TFT*, IEEE Electron Device Letters, vol. 14, No. 8, Aug. 1993, pp. 403-405.
J. J. Licari, "Plastic Coatings for Electronics," McGraw-Hill Book Co., 1970, pp. 57-64.
Specification, Claims, Abstract and Drawings of U.S. Appl. No. 10/815,654 filed Apr. 2, 2004.
Preliminary Amendment for U.S. Appl. No. 10/815,654 filed Apr. 2, 2004.
Preliminary Amendment for U.S. Appl. No. 10/815,654 filed Jun. 30, 2004.
Second Preliminary Amendment for U.S. Appl. No. 10/815,654 filed Aug. 20, 3004.
Restriction/Election Requirement for U.S. Appl. No. 10/815,654 mailed Nov. 28, 2005.
Response to Restriction/Election Requirement for U.S. Appl. No. 10/815,654, filed Dec. 28, 2005.
Office Action for U.S. Appl. No. 10/815,654 mailed Jan. 26, 2006.
Amendment for U.S. Appl. No. 10/815,654 filed Apr. 26, 2006.
Office Action for U.S. Appl. No. 10/815,654 mailed Jul. 14, 2006.
Response for U.S. Appl. No. 10/815,654 filed Nov. 14, 2006.
Office Action for U.S. Appl. No. 10/815,654 mialed Feb. 12, 2007.
Amendment for U.S. Appl. No. 10/815,654 filed Jun. 12, 2007.
Office Action for U.S. Appl. No. 10/815,654 mailed Sep. 11, 2007.
Amendment for U.S. Appl. No. 10/815,654 filed Jan. 11, 2008.
Office Action for U.S. Appl. No. 10/815,654 mailed May 6, 2008.
Specification, Claims, Abstract and Drawings of U.S. Appl. No. 10/815,653 as filed. Apr. 2, 2004.
Preliminary Amendment for U.S. Appl. No. 10/815,653 filed Apr. 2, 2004.
Preliminary Amendment for U.S. Appl. No. 10/815,653 filed Jun. 30, 2004.
Restriction/Election Requirement for U.S. Appl. No. 10/815,653 mailed May 6, 2005
Response to Restriction/Election Requirement for U.S. Appl. No. 10/815,653 filed Jun. 6, 2005.
Restriction/Election Requirement for U.S. Appl. No. 10/815,653 mailed Aug. 24, 2005.
Amendment and Response to Restriction/Election Requirement for U.S. Appl. No. 10/815,653 filed Sep. 23, 2005.
Office Action for U.S. Appl. No. 10/815,653 mailed Dec. 16, 2005.
Amendment for U.S. Appl. No. 10/815,653 filed Mar. 16, 2006.
Office Action for U.S. Appl. No. 10/815,653 mailed Jun. 8, 2006.
Amendment for U.S. Appl. No. 10/815,653 filed Sep. 8, 2006.
Office Action for U.S. Appl. No. 10/815,653 mailed Dec. 4, 2006.
Amendment for U.S. Appl. No. 10/815,653 filed Mar. 5, 2007.
Office Action for U.S. Appl. No. 10/815,653 mailed May 31, 2007.
Amendment for U.S. Appl. No. 10/815,653 filed Aug. 31, 2007.
Office Action for U.S. Appl. No. 10/815,653 mailed Nov. 29, 2007.
Response for U.S. Appl. No. 10/815,653 filed Feb. 29, 2008.
Advisory Action for U.S. Appl. No. 10/815,653 mailed Mar. 27, 2008.
Specification, Claims, Abstract and Drawings of U.S. Appl. No. 10/852,125 as filed May 25, 2004.
Preliminary Amendment for U.S. Appl. No. 10/852,125 filed May 25, 2004.
Office Action for U.S. Appl. No. 10/852,125 mailed Sep. 23, 2004.
Amendment for U.S. Appl. No. 10/852,125 filed Jan. 24, 2005.
Restriction/Election Requirement for U.S. Appl. No. 10/852,125 mailed Apr. 19, 2005.
Amendment and Response to Restriction/Election Requirement for U.S. Appl. No. 10/852,125 filed May 19, 2005.
Restriction/Election Requirement for U.S. Appl. No. 10/852,125 mailed Aug. 10, 2005.
Amendment and Response to Restriction/Election Requirement for U.S. Appl. No. 10/852,125 filed Sep. 9, 2005.
Office Action for U.S. Appl. No. 10/852,125 mailed Nov. 28, 2005.
After FInal Amendment for U.S. Appl. No. 10/852,125 filed Mar. 28, 2006.
Advisory Action for U.S. Appl. No. 10/852,125 mailed Apr. 12, 2006.
Office Action for U.S. Appl. No. 10/852,125 mailed Jun. 5, 2006.
Amendment for U.S. Appl. No. 10/852,125 filed Sep. 5, 2006.
Office Action for U.S. Appl. No. 10/852,125 mailed Nov. 21, 2006.

Response for U.S. Appl. No. 10/852,125 filed Feb. 21, 2007.
Office Action for U.S. Appl. No. 10/852,125 mailed May 18, 2007.
Response for U.S. Appl. No. 10/852,125 filed Aug. 20, 2007.
Office Action for U.S. Appl. No. 10/852,125 mailed Nov. 16, 2007.
Amendment for U.S. Appl. No. 10/852,125 filed Feb. 19, 2008.
Office Action for U.S. Appl. No. 10/852,125 mailed Jun. 13, 2008.
Specification, Claims, Abstract and Drawings of U.S. Appl. No. 10/925,980 as filed Aug. 26, 2004.
Preliminary Amendment for U.S. Appl. No. 10/925,980 filed Aug. 26, 2004.
Office Action for U.S. Appl. No. 10/925,980 mailed Feb. 7, 2005.
Amendment for U.S. Appl. No. 10/925,980 filed May 9, 2005.
Restriction/Election Requirement for U.S. Appl. No. 10/925,980 mailed Jul. 27, 2005.
Amendment and Response to Restriction/Election Requirement for U.S. Appl. No. 10/925,980 filed Aug. 26, 2005.
Office Action for U.S. Appl. No. 10/925,980 mailed Nov. 16, 2005.
After Final Amendment for U.S. Appl. No. 10/925,980 mailed Mar. 16, 2006.
Advisory Action for U.S. Appl. No. 10/925,980 mailed Mar. 31, 2006.
Office Action for U.S. Appl. No. 10/925,980 filed Jun. 8, 2006.
Response for U.S. Appl. No. 10/925,980 filed Sep. 8, 2006.
Office Action for U.S. Appl. No. 10/925,980 mailed Mar. 19, 2007.
Amendment for U.S. Appl. No. 10/925,980 filed Jun 19, 2007.
Advisory Action for U.S. Appl. No. 10/925,980 mailed Jul. 6, 2007.
Amendment for U.S. Appl. No. 10/925,980 filed Aug. 20, 2007.
Office Action for U.S. Appl. No. 10/925,980 mailed Sep. 5, 2007.
Amendment for U.S. Appl. No. 10/925,980 filed Jan. 7, 2008.
Notice of Allowance for U.S. Appl. No. 10/925,980 mailed Mar. 21, 2008.

* cited by examiner

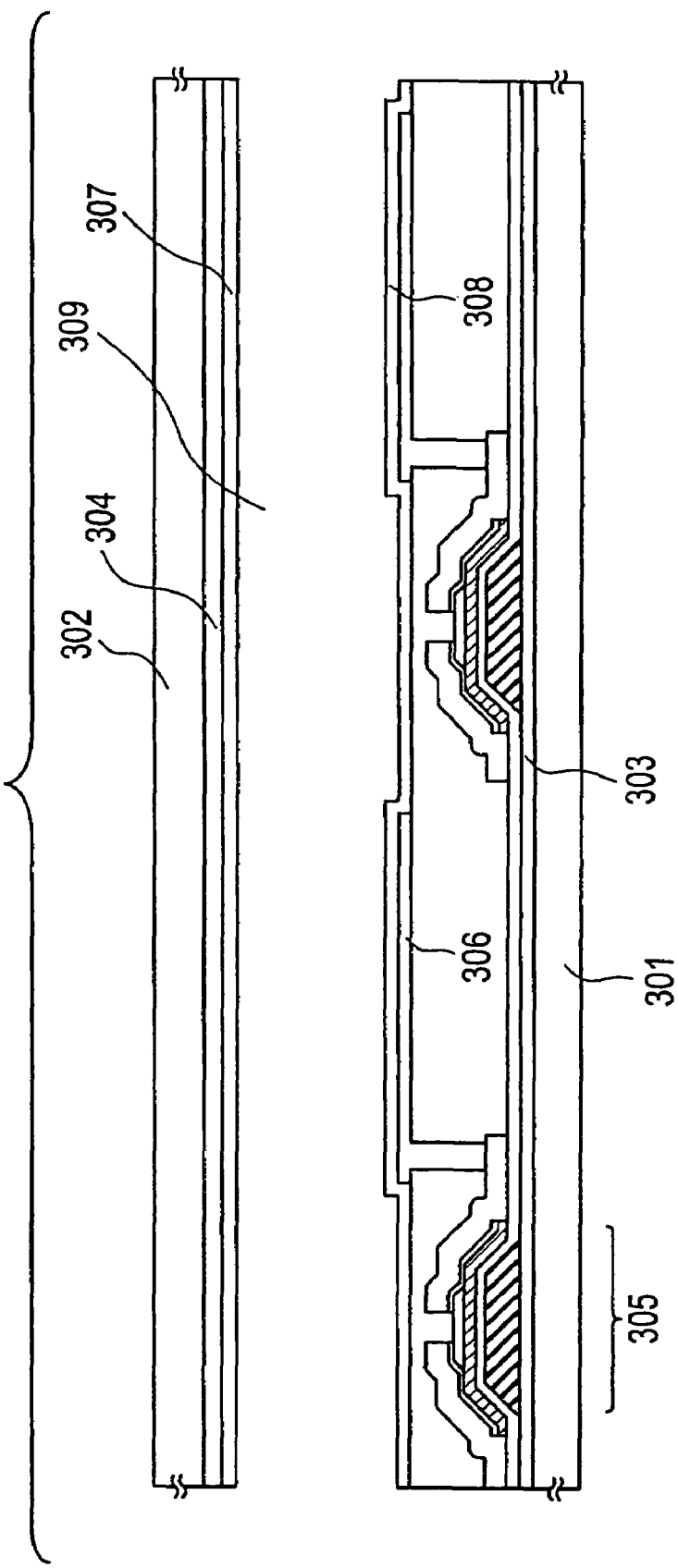
FIG. (3)

SEMICONDUCTOR DEVICE, METHOD OF FABRICATING SAME, AND ELECTROOPTICAL DEVICE

BACKGROUND OF THE INVENTION

1. Field of the Invention

The present invention relates to a configuration of thin-film transistors (TFTs) formed on a flexible substrate (i.e., having mechanical flexibility) such as a resinous substrate which can be made of engineering plastics. The invention also relates to a method of fabricating such thin-film transistors. Furthermore, the invention relates to an active matrix liquid crystal display fabricated, using these thin-film transistors.

2. Prior Art

Thin-film transistors formed on glass substrates or on quartz substrates are known. Thin-film transistors formed on glass substrates are chiefly used in active matrix liquid crystal displays. Since active matrix liquid crystal displays can display images with high response and with high information content, it is expected that they can supplant simple matrix liquid crystal displays.

In an active matrix liquid crystal display, one or more thin-film transistors are disposed as a switching element at each pixel. Electric charge going in and out of the pixel electrode is controlled by this thin-film transistor. The substrates are made of glass or quartz, because it is necessary that visible light pass through the liquid crystal display.

Liquid crystal displays are display means which are expected to find quite extensive application. For example, they are expected to be used as display means for card-type computers, portable computers, and portable electronic devices for various telecommunication appliances. As more sophisticated information is treated, more sophisticated information is required to be displayed on the display means used for these portable electronic devices. For example, there is a demand for functions of displaying higher information content and moving pictures as well as numerals and symbols.

Where a liquid crystal display is required to have a function of displaying higher information content and moving pictures, it is necessary to utilize an active matrix liquid crystal display. However, where substrates made of glass or quartz are used, various problems take place: (1) limitations are imposed on thinning of the liquid crystal display itself; (2) the weight is increased; (3) if the thickness is reduced in an attempt to reduce the weight, the substrate breaks; and (4) the substrate lacks flexibility.

Especially, card-type electronic devices are required to be so flexible that they are not damaged if slight stress is exerted on them when they are treated. Therefore, liquid crystal displays incorporated in these electronic devices are similarly required to be flexible.

The invention disclosed herein provides an active matrix liquid crystal display having flexibility.

SUMMARY OF THE INVENTION

One available method of imparting flexibility to a liquid crystal display is to use plastic or resinous substrates which transmit light. However, because of poor heat resistance of resinous substrates, it is technically difficult to form thin-film transistors on them.

Accordingly, the invention disclosed herein solves the foregoing difficulty by adopting the following configuration:

One invention disclosed herein comprises: a filmy resinous substrate; a resinous layer formed on a surface of said resinous substrate; and thin-film transistors formed on said resinous layer.

A specific example of the above-described configuration is shown in FIG. 1. In the configuration shown in FIG. 1, a resinous layer 102 is in contact with a PET film 101 having a thickness of 100 µm, the PET film being a filmy resinous substrate. Inverted-staggered thin-film transistors are formed on the resinous layer.

The material of the filmy resinous substrate can be selected from PET (polyethylene terephthalate), PEN (polyethylene naphthalate), PES (polyethylene sulfite), and polyimide. The requirements are flexibility and transparency. Preferably, the maximum temperature that the material can withstand is made as high as possible. If the heating temperature is elevated above 200° C., oligomers (polymers having diameters of about 1 µm) are generally deposited on the surface, or gases are produced. Therefore, it is quite difficult to form a semiconductor layer on the resinous substrate. Consequently, the material should have the highest possible processing temperature.

In the above-described structure, the resinous layer acts to planarize the surface of the resinous substrate. The planarization also serves to prevent precipitation of oligomers on the surface of the resinous substrate during steps involving heating such as the step for forming the semiconductor layer.

The material of this resinous layer can be selected from methyl esters of acrylic acid, ethyl esters of acrylic acid, butyl esters of acrylic acid, and 2-ethylhexyl esters of acrylic acid. Even if resinous substrates are used, this resinous layer can suppress the drawbacks with fabrication of the afore-mentioned thin-film transistors.

The configuration of another invention comprises the steps of: forming a resinous layer on a filmy resinous substrate; forming a semiconductor layer on said resinous layer by plasma-assisted CVD; and forming thin-film transistors, using said semiconductor layer.

The configuration of a further invention comprises the steps of: heat-treating a filmy resinous substrate at a given temperature to degas said resinous substrate; forming a resinous layer on the filmy resinous substrate; forming a semiconductor layer on said resinous substrate by plasma-assisted CVD; and forming thin-film transistors, using said semiconductor layer.

In the above-described structure, heat-treatment is made to degas the resinous substrate, in order to prevent escape of gases from the resinous substrate during later processes involving heating. For example, if gases are released from the resinous substrate when a semiconductor thin film is being formed on the resinous substrate, then large pinholes are formed in the semiconductor thin film. This greatly impairs the electrical characteristics. Accordingly, the substrate is heat-treated at a temperature higher than heating temperatures used in the later processes, to degas the resinous substrate. In this way, release of gases from the resinous substrate during the later steps can be suppressed.

The configuration of a yet other invention comprises the steps of: heat-treating a filmy resinous substrate at a given temperature; forming a resinous layer on said filmy resinous substrate; forming a semiconductor layer on said resinous substrate by plasma-assisted CVD while heating the substrate to a temperature lower than said given temperature; and forming thin-film transistors, using said semiconductor layer.

The configuration of a still other invention comprises the steps of: heat-treating a filmy resinous substrate at a given temperature which is higher than any heat-treatment temperature used in other steps; forming a resinous layer on said filmy resinous substrate; forming a semiconductor layer on said resinous substrate by plasma-assisted CVD; and forming thin-film transistors, using said semiconductor layer.

The configuration of a still further invention comprises: a pair of filmy resinous substrates; a liquid crystal material held between said resinous substrates; pixel electrodes formed on a surface of at least one of said resinous substrates; thin-film transistors connected with said pixel electrodes and formed on said resinous substrate; and resinous layers formed on surfaces of said filmy resinous substrates to planarize the surfaces.

A specific example of the above-described structure is shown in FIG. 3. In the structure shown in FIG. 3, a pair of resinous substrates 301, 302, a liquid crystal material 309 held between these resinous substrates, pixel electrodes 306, thin-film transistors (TFTs) 305 connected with the pixel electrodes 306, and a resinous layer 303 for planarizing the surface of the resinous substrate 301.

BRIEF DESCRIPTION OF THE DRAWINGS

FIG. 3 is a schematic cross-sectional view of a liquid crystal panel.

DETAILED DESCRIPTION OF THE PREFERRED EMBODIMENTS

Example 1

The present example shows an example in which inverted-staggered TFTs are formed on a substrate of PET (polyethylene terephthalate) which is an organic resin.

Figure 1A:
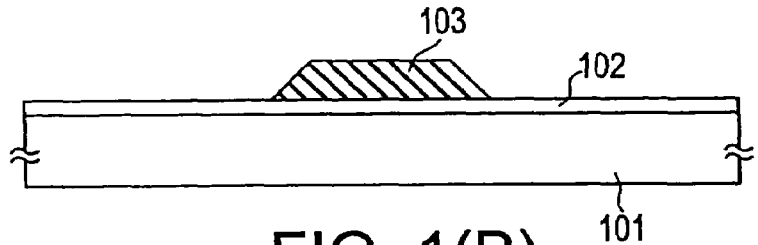
FIGS. 1(A) to 1(E) are views illustrating a process sequence for fabricating thin-film transistors according to the present invention.

As shown in FIG. 1(A), a PET film 101 having a thickness of 100 μm is first prepared and heat-treated to degas the film. This heat-treatment is required to be conducted at a temperature higher than the highest temperature applied in later processes. In the processes shown in the present example, a temperature of 160° C. used during formation of an amorphous silicon film by plasma-assisted CVD is the highest heating temperature. Therefore, the heat-treatment for degassing the PET film is performed at 180° C.

A layer of an acrylic resin 102 is formed on this PET film 101. As an example, a methyl ester of acrylic acid can be used as the acrylic resin. This acrylic resin layer 102 acts to prevent precipitation of oligomers on the surface of the PET film 101 in processes conducted later. The acrylic resin layer 102 also serves to planarize the uneven surface of the PET film 102. Generally, PET film surface has unevenness of the order of several hundreds of angstroms to 1 μm. Such unevenness greatly affects the electrical properties of the semiconductor layer having a thickness of several hundreds of angstroms. Therefore, it is quite important to planarize the base on which the semiconductor layer is formed.

Then, gate electrodes 103 of aluminum are formed. The gate electrodes 103 are formed by forming an aluminum film to a thickness of 2000 to 5000 Å (3000 Å in this example) by sputtering and performing a well-known patterning step making use of photolithography. The gate electrodes 103 are etched so that the side surfaces are tapered (FIG. 1(A)).

Thereafter, a silicon oxide film acting as a gate-insulating film 104 is formed to a thickness of 1000 Å by sputtering. The gate-insulating film 104 may be made from silicon nitride instead of silicon oxide.

Subsequently, a substantially intrinsic (I-type) amorphous silicon film 105 is formed to a thickness of 500 Å by plasma-assisted CVD under the following conditions:

| film formation temperature (at which the substrate is heated): | 160° C. |
|---|---|
| reaction pressure: | 0.5 torr |
| RF power (13.56 MHz): | 20 mW/cm$^2$ |
| reactant gas: | SiH$_4$ |

Figure 1B:
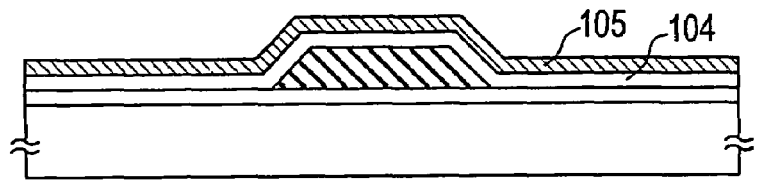

In this example, the film is formed, using a parallel-plate plasma-CVD machine. The substrate is heated by a heater disposed within a substrate stage in which the resinous substrate is placed. In this way, the state shown in FIG. 1(B) is obtained.

Then, a silicon oxide film which acts as an etch stopper in a later step is formed by sputtering and then patterned to form an etch stopper 106.

Thereafter, an n-type amorphous silicon film 107 is formed to a thickness of 300 Å by parallel-plate plasma-assisted CVD under the following conditions:

| film formation temperature (at which the substrate is heated): | 160° C. |
|---|---|
| reaction pressure: | 0.5 torr |
| RF power (13.56 MHz): | 20 mW/cm$^2$ |
| reactant gases: | B$_2$H$_6$/SiH$_4$ = 1/100 |

Figure 1C:
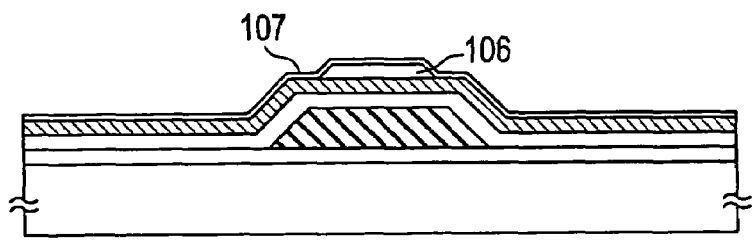
Figure 1D:
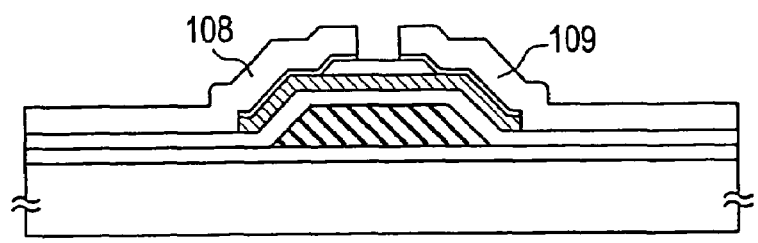

In this way, the state shown in FIG. 1(C) is obtained. Then, the n-type amorphous silicon film 107 and the substantially intrinsic (I-type) amorphous silicon film 105 are patterned by a dry-etching process. An aluminum film is formed to a thickness of 3000 Å by sputtering techniques. Thereafter, this aluminum film and the underlying n-type amorphous silicon film 107 are etched to form source electrodes 108 and drain electrodes 109. During this etching process, the action of the etch stopper 106 assures that the source and drain regions are isolated from each other (FIG. 1(D)).

Figure 1E:
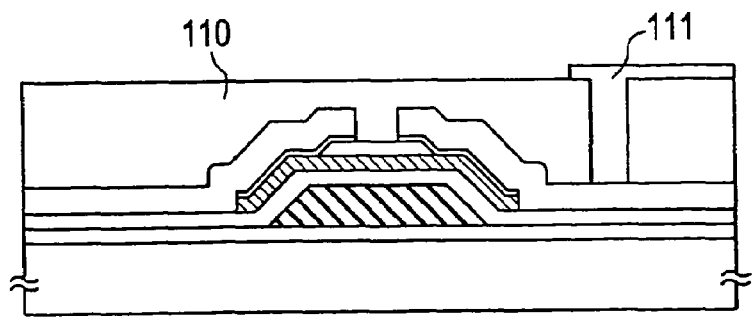

An interlayer dielectric layer 110 is formed out of silicon oxide or a resinous material such as polyimide to a thickness of 6000 Å. Where a silicon oxide film is formed, a liquid which is applied when the silicon oxide film is formed may be used. Finally, contact holes are formed, and pixel electrodes 111 are fabricated from ITO. In this way, thin-film transistors arranged at the pixel electrodes of the active matrix liquid crystal display can be fabricated, using the transparent resinous substrate (FIG. 1(E)).

Example 2

The present example shows a case in which an active matrix liquid crystal display is fabricated, using the thin-film transistors described in Example 1. The liquid crystal electrooptical device described in the present example is shown in FIG. 3 in cross section.

In FIG. 3, PET films 301 and 302 having a thickness of 100 μm form a pair of substrates. An acrylic resin layer 303 acts as a planarizing layer. Indicated by 306 are pixel electrodes. In FIG. 3, only the structure corresponding to two pixels is shown.

Indicated by 304 is a counter electrode. Orientation films 307 and 308 orient a liquid crystal 309 which can be a twisted-nematic (TN) liquid crystal, supertwisted-nematic (STN) liquid crystal, or a ferroelectric liquid crystal. Generally, a TN liquid crystal is employed. The thickness of the liquid crystal layer is several micrometers to about 10 μM.

Thin-film transistors (TFTs) 305 are connected with the pixel electrodes 306. Electric charge going in and out of the pixel electrodes 306 is controlled by the TFTs 305. In this example, only one of the pixel electrodes 306 is shown as a typical one but a required number of other configurations of similar structure are also formed.

In the structure shown in FIG. 3, the substrates 301 and 302 have flexibility and so the whole liquid crystal panel can be made flexible.

Example 3

The present example shows an example in which coplanar thin-film transistors used for an active matrix liquid crystal display are fabricated. The process sequence for fabricating the thin-film transistors of the present example is shown in FIG. 2. First, a PET film 201 having a thickness of 100 μm is prepared as a filmy organic resin substrate. The film is heated-treated at 180° C. to promote degassing from the PET film 201. A layer of an acrylic resin 202 is formed on the surface of the film. In this example, an ethyl ester of acrylic acid is used as the acrylic resin.

Then, a substantially intrinsic (I-type) semiconductor layer 203 in which a channel formation region is formed is grown by plasma-assisted CVD under the following conditions:

| | |
|---|---|
| film formation temperature (at which the substrate is heated): | 160° C. |
| reaction pressure: | 0.5 torr |
| RF power (13.56 MHz): | 20 mW/cm$^2$ |
| reactant gas: | SiH$_4$ |

In this example, a parallel-plate plasma-CVD machine is used to grow the film.

Then, an n-type amorphous silicon film is grown to a thickness of 300 Å by the parallel-plate plasma-CVD machine under the following conditions:

| | |
|---|---|
| film formation temperature (at which the substrate is heated): | 160° C. |
| reaction pressure: | 0.5 torr |
| RF power (13.56 MHz): | 20 mW/cm$^2$ |
| reactant gases: | B$_2$H$_6$/SiH$_4$ = 1/100 |

Figure 2A:
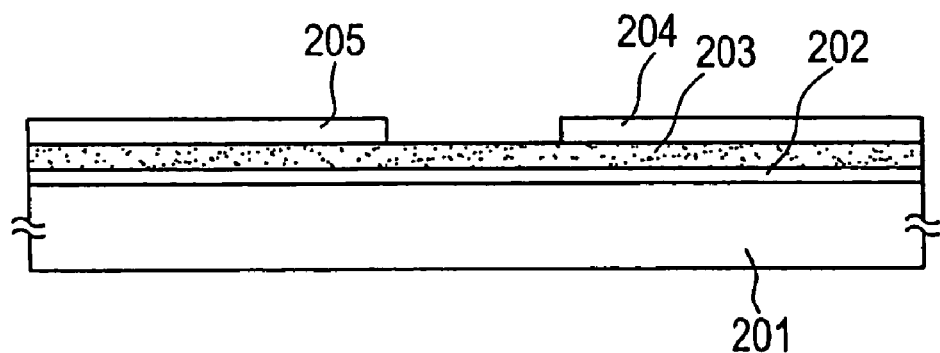
FIGS. 2(A) to 2(C) are views illustrating another process sequence for fabricating thin-film transistors according to the present invention.
Figure 2B:
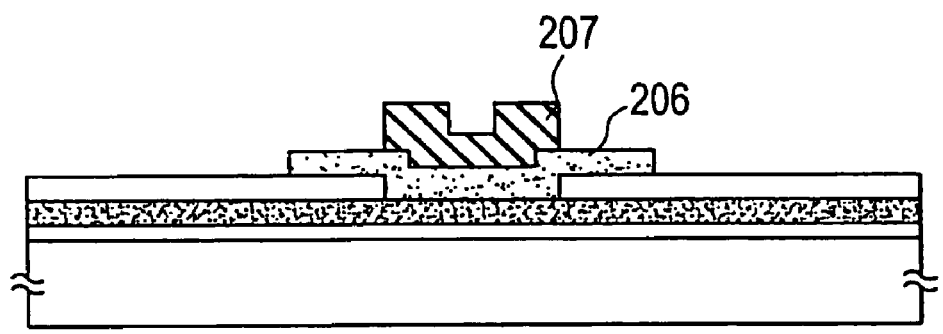
Figure 2C:
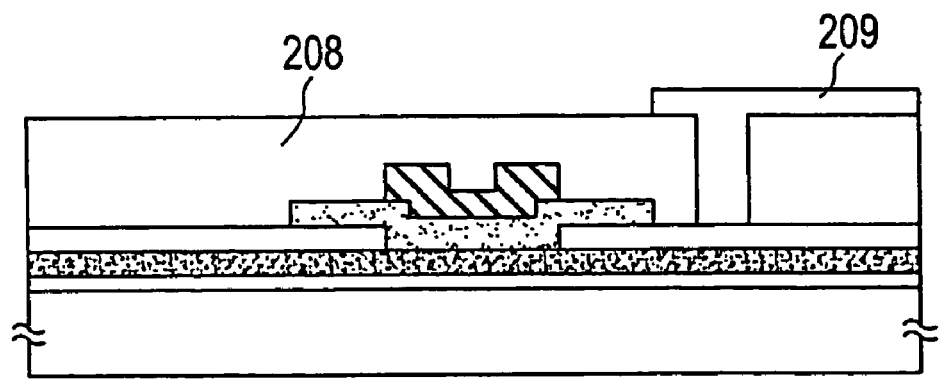

The n-type amorphous silicon film is patterned to form source regions 205 and drain regions 204 (FIG. 2(A)).

A silicon oxide film or silicon nitride film acting as a gate-insulating film is formed by sputtering techniques and patterned to form the gate-insulating film 206. Gate electrodes 207 are then formed from aluminum (FIG. 2(B)).

A polyimide layer 208 is formed as an interlayer dielectric film to a thickness of 5000 Å. Contact holes are formed. ITO electrodes 209 becoming pixel electrodes are formed by sputtering, thus completing TFTs (FIG. 2(C)).

Example 4

The present example is similar to the structure of Example 1 or 2 except that the semiconductor layer is made of a microcrystalline semiconductor film. First, a substantially intrinsic semiconductor layer is grown as the microcrystalline semiconductor layer under the following conditions:

| | |
|---|---|
| film formation temperature (at which the substrate is heated): | 160° C. |
| reaction pressure: | 0.5 torr |
| RF power (13.56 MHz): | 150 mW/cm$^2$ |
| reactant gases: | SiH$_4$/H$_2$ = 1/30 |

In this example, a parallel-plate plasma-CVD machine is used to grow the film.

The conditions under which an n-type microcrystalline silicon film is grown are described below. Also in this case, a parallel-plate plasma-CVD machine is used.

| | |
|---|---|
| film formation temperature (at which the substrate is heated): | 160° C. |
| reaction pressure: | 0.5 torr |
| RF power (13.56 MHz): | 150 mW/cm$^2$ |
| reactant gases: | B$_2$H$_6$/SiH$_4$ = 1/100 |

Generally, a microcrystalline silicon film can be obtained by supplying power of 100 to 200 mW/cm$^2$. In the case of the I-type semiconductor layer, desirable results are obtained by diluting silane with hydrogen by a factor of about 10 to 50, as well as by increasing the power. However, if the hydrogen dilution is made, the film growth rate drops.

Example 5

The present example relates to a method consisting of irradiating a silicon film with laser light having such a power that the filmy base or substrate is not heated, the silicon film having been formed by plasma-assisted CVD as described in the other examples.

A technique for changing an amorphous silicon film formed on a glass substrate into a crystalline silicon film by irradiating the amorphous film with laser light (e.g., KrF excimer laser light) is known. In another known technique, impurity ions for imparting one conductivity type are implanted into the silicon film and then the silicon film is irradiated with laser light to activate the silicon film and the impurity ions. The implantation of the impurity ions amorphizes the silicon film.

The configuration described in the present example makes use of a laser irradiation process as described above, and is characterized in that the amorphous silicon film 105 shown in FIG. 1 or the amorphous silicon films 203 and 204 shown in FIG. 2 are irradiated with quite weak laser light to crystallize the amorphous silicon film. If the previously formed film is a microcrystalline silicon film, the crystallinity can be improved.

KrF excimer laser or XeCl excimer laser can be used to emit the laser light. The energy of the emitted laser light is 10 to 50 mJ/cm$^2$. It is important that the resinous substrate 101 or 102 be not thermally damaged.

By utilizing the invention disclosed herein, the thickness of an active matrix liquid crystal display can be reduced. Also, the weight can be decreased. If an external force is applied, the substrates do not break. Flexibility can be imparted to the display.

This liquid crystal display can find wide application and is quite useful.

What is claimed is:

1. A portable electronic device comprising:
a resinous substrate comprising polyethylene naphthalate;
a thin film transistor formed over the resinous substrate with a resinous layer interposed therebetween, the thin film transistor including a channel forming region and a gate electrode with a gate insulating film interposed therebetween; and
a silicon oxide film covering the thin film transistor, wherein the silicon oxide film is formed by applying a liquid.

2. A portable electronic device comprising:
a flexible substrate comprising polyethylene naphthalate;
a thin film transistor formed over the flexible substrate with a resinous layer interposed therebetween, the thin film transistor including a channel forming region and a gate electrode with a gate insulating film interposed therebetween; and
a silicon oxide film covering the thin film transistor, wherein the silicon oxide film is formed by applying a liquid.

3. A portable electronic device comprising:
a resinous substrate comprising polyethylene naphthalate;
a first and a second thin film transistors formed over the resinous substrate with a resinous layer interposed therebetween, each of the first and the second thin film transistors including a channel forming region comprising crystalline silicon and a gate electrode with a gate insulating film interposed therebetween; and
a silicon oxide film covering the first and the second thin film transistors, wherein the silicon oxide film is formed by applying a liquid.

4. A portable electronic device comprising:
a flexible substrate comprising polyethylene naphthalate;
a first and a second thin film transistors formed over the flexible substrate with a resinous layer interposed therebetween, each of the first and the second thin film transistors including a channel forming region comprising crystalline silicon and a gate electrode with a gate insulating film interposed therebetween; and
a silicon oxide film covering the first and the second thin film transistors, wherein the silicon oxide film is formed by applying a liquid.

5. A portable electronic device comprising:
a resinous substrate comprising polyethylene naphthalate;
a thin film transistor formed over the resinous substrate with a resinous layer interposed therebetween; and
a silicon oxide film covering the thin film transistor, wherein the silicon oxide film is formed by applying a liquid,
wherein the thin film transistor includes a channel forming region comprising a crystalline silicon and a gate electrode with a gate insulating film interposed therebetween, and
wherein the crystalline silicon is formed by laser irradiation.

6. A portable electronic device comprising:
a flexible substrate comprising polyethylene naphthalate;
a thin film transistor formed over the flexible substrate with a resinous layer interposed therebetween;
a thin film transistor formed over the resinous layer; and
a silicon oxide film covering the thin film transistor, wherein the silicon oxide film is formed by applying a liquid,
wherein the thin film transistor includes a channel forming region comprising a crystalline silicon and a gate electrode with a gate insulating film interposed therebetween, and
wherein the crystalline silicon is formed by laser irradiation.

7. A portable electronic device comprising:
a pair of resinous substrates opposing to each other, wherein the pair of resinous substrates comprise polyethylene naphthalate;
a resinous layer formed on at least one of the pair of resinous substrates;
a thin film transistor formed between the pair of resinous substrates and formed on the resinous layer, the thin film transistor including a channel forming region and a gate electrode with a gate insulating film interposed therebetween; and
a silicon oxide film covering the thin film transistor, wherein the silicon oxide film is formed by applying a liquid.

8. A portable electronic device comprising:
a pair of flexible substrates opposing to each other, wherein the pair of flexible substrates comprise polyethylene naphthalate;
a resinous layer formed on at least one of the pair of flexible substrates;
a thin film transistor formed between the pair of flexible substrates and formed on the resinous layer, the thin film transistor including a channel forming region and a gate electrode with a gate insulating film interposed therebetween; and
a silicon oxide film covering the thin film transistor, wherein the silicon oxide film is formed by applying a liquid.

9. A portable electronic device comprising:
a pair of resinous substrates opposing to each other, wherein the pair of resinous substrates comprise polyethylene naphthalate;
a resinous layer formed on at least one of the pair of resinous substrates;
a thin film transistor formed between the pair of resinous substrates and formed on the resinous layer, the thin film transistor including a channel forming region comprising crystalline silicon and a gate electrode with a gate insulating film interposed therebetween; and
a silicon oxide film covering the thin film transistor, wherein the silicon oxide film is formed by applying a liquid.

10. A portable electronic device comprising:
a pair of flexible substrates opposing to each other, wherein the pair of flexible substrates comprise polyethylene naphthalate;
a resinous layer formed on at least one of the pair of flexible substrates;
a thin film transistor formed between the pair of flexible substrates and formed on the resinous layer, the thin film transistor including a channel forming region comprising crystalline silicon and a gate electrode with a gate insulating film interposed therebetween; and
a silicon oxide film covering the thin film transistor, wherein the silicon oxide film is formed by applying a liquid.

11. A portable electronic device comprising:
a pair of resinous substrates opposing to each other, wherein the pair of resinous substrates comprise polyethylene naphthalate;
a resinous layer formed on at least one of the pair of resinous substrates;
a thin film transistor formed between the pair of resinous substrates and formed on the resinous layer; and
a silicon oxide film covering the thin film transistor, wherein the silicon oxide film is formed by applying a liquid,
wherein the thin film transistor includes a channel forming region comprising a crystalline silicon and a gate electrode with a gate insulating film interposed therebetween, and
wherein the crystalline silicon is formed by laser irradiation.

12. A portable electronic device comprising:
a pair of flexible substrates opposing to each other, wherein the pair of flexible substrates comprise polyethylene naphthalate;
a resinous layer formed on at least one of the pair of flexible substrates;
a thin film transistor formed between the pair of flexible substrates and formed on the resinous layer; and
a silicon oxide film covering the thin film transistor, wherein the silicon oxide film is formed by applying a liquid,
wherein the thin film transistor includes a channel forming region comprising a crystalline silicon and a gate electrode with a gate insulating film interposed therebetween, and
wherein the crystalline silicon is formed by laser irradiation.

13. A portable electronic device according to any one of claims 1,2,3,4,5,6,7,8,9,10,11,12, wherein the portable electronic device is a portable computer.

14. A portable electronic device according to any one of claims 3,4,9,10, wherein the laser light comprises at least one selected from the group consisting of KrF excimer laser light and XeCl laser light.

15. A portable electronic device according to any one of claims 1,3,5,7,9,11, wherein the resinous substrate comprises a plastic substrate.

16. A portable electronic device according to any one of claims 4,6,8,10,12, wherein the flexible substrate comprises a plastic substrate.

17. A portable electronic device according to any one of claims 1,2,3,4,5,6,7,8,9,10,11,12, wherein the resinous layer comprises an acrylic resin.

18. A portable electronic device according to any one of claims 1,2,3,4,5,6,7,8,9,10,11,12, wherein the resinous layer comprises at least one selected from the group consisting of methyl esters of acrylic acid, ethyl esters of acrylic acid, butyl esters of acrylic acid, and 2-ethylhexyl esters of acrylic acid.

19. A portable electronic device according to any one of claims 1,2,3,4,5,6,7,8,9,10,11,12, wherein the thin film transistor comprises an inverted-staggered thin-film transistor.

20. A portable electronic device according to any one of claims 1,2,3,4,5,6,7,8,9,10,11,12, wherein the thin film transistor comprises a coplanar thin-film transistor.

* * * * *